Jan. 7, 1964 W. S. MORTLEY 3,117,293

LINEAR FREQUENCY SWEEP OF RESONANT CIRCUIT BY EXPONENTIALLY VARYING REVERSE BIAS ON SEMICONDUCTOR DIODE

Filed Nov. 3, 1961 4 Sheets-Sheet 1

INVENTOR
Wilfrid Sinden Mortley
BY Baldwin & Wight
ATTORNEYS

LINEAR FREQUENCY SWEEP OF RESONANT CIRCUIT BY EXPONENTIALLY VARYING REVERSE BIAS ON SEMICONDUCTOR DIODE

Filed Nov. 3, 1961 4 Sheets-Sheet 2

INVENTOR
Wilfrid Sinden Mortley
BY Baldwin & Wight
ATTORNEYS

INVENTOR
Wilfrid Sinden Mortley
BY
Baldwin & Wight
ATTORNEYS

Jan. 7, 1964 W. S. MORTLEY 3,117,293

LINEAR FREQUENCY SWEEP OF RESONANT CIRCUIT BY EXPONENTIALLY VARYING REVERSE BIAS ON SEMICONDUCTOR DIODE

Filed Nov. 3, 1961 4 Sheets-Sheet 4

INVENTOR

Wilfrid Sinden Mortley

BY Baldwin & Wight

ATTORNEYS

United States Patent Office 3,117,293
Patented Jan. 7, 1964

3,117,293
LINEAR FREQUENCY SWEEP OF RESONANT CIRCUIT BY EXPONENTIALLY VARYING REVERSE BIAS ON SEMICONDUCTOR DIODE

Wilfrid Sinden Mortley, Great Baddow, England, assignor to The Marconi Company Limited, a British company
Filed Nov. 3, 1961, Ser. No. 150,015
Claims priority, application Great Britain Dec. 8, 1960
10 Claims. (Cl. 334—15)

Figure 1:
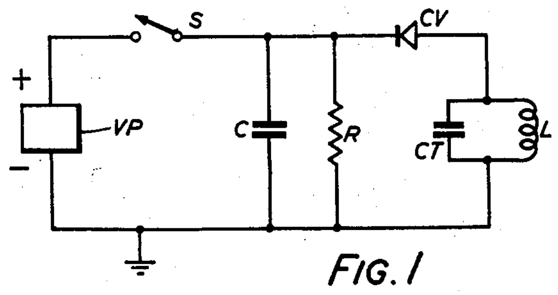

This invention relates to frequency varying circuit arrangements and, more particularly, to circuit arrangements for varying the resonant frequency of a tuned circuit.

Frequency varying circuit arrangements, as at present known, commonly employ a variable reactance device, e.g. a reactance valve or a so-called semi-conductor condenser, i.e. a semi-conductor device whose effective capacitance is dependent on the reverse-biassing voltage across it, as part of a tuned circuit and a control signal, in accordance with which the frequency of the tuned circuit is to be modulated, is applied to vary the reactance of said device. These known arrangements suffer from the defect that the relationship between the control signal and the frequency of the tuned circuit is not sufficiently linear for some purposes, more particularly where a large frequency sweep is required, and although improved linearity may be obtained by carrying out the frequency modulation at a higher frequency and subsequently changing the frequency to the desired one this has the disadvantages that the frequency stability of the arrangement is reduced and that the arrangement is likely to produce unwanted frequencies as a result of frequency changing.

It is the object of the present invention to provide frequency varying circuit arrangements which shall be of improved linearity and free of the above-mentioned disadvantages.

According to this invention in its broadest aspect a frequency varying circuit arrangement comprises a resonant circuit including a voltage sensitive condenser constituted by a semi-conductor device of the kind presenting a capacitance which is dependent on the value of a reverse bias voltage applied to said device, means for deriving a voltage varying exponentially with a predetermined quantity and means for applying to said device as reverse bias voltage a voltage comprising at least in part of said derived voltage.

Where said device is in a parallel branch of said resonant circuit the effective capacitance of said branch at the mean frequency of the range over which said circuit arrangement is designed to vary is preferably at least approximately equal to two thirds of the total effective capacitance of said resonant circuit.

Preferably said semi-conductor device is a junction diode of the kind in which a so-called "depletion layer" is formed i.e. in which the junction is not diffuse. Preferably said diode is a silicon junction diode.

In one form of embodiment wherein the frequency of the resonant circuit is required to vary substantially linearly with time the applied reverse bias includes a derived voltage varying exponentially with time.

Such a voltage may be derived by discharging a condenser to produce across the same a voltage decaying exponentially with time or by releasing the energy stored in an inductance by completing a circuit including said inductance and utilising the exponentially decaying current to provide a corresponding voltage. Energy may be stored in the condenser or inductance by connection to a source of unidirectional potential. Preferably said source is a pulse source operating at the repetition frequency equal to that at which said linear frequency variation is to be produced.

In another form of embodiment wherein the frequency of the resonant circuit is required to vary substantially linearly in accordance with a modulating input signal wave there is provided means for producing from said input signal wave a derived signal wave of amplitude varying substantially exponentially with the amplitude of the input signal wave, and the derived signal wave is applied as reverse bias to said device.

One arrangement for producing the derived signal wave from the input signal wave comprises a plurality of parallel branches each including a differently biassed unilaterally conductive device in series with an impedance and the input signal is applied, in series with an impedance (which may be constituted, at least in part, by the internal impedance of the source of input signals), across the parallel branches in opposition to the bias of said unilaterally conductive devices whereby the effective impedance of said parallel branches, and hence the proportion of the input signal appearing across said branches, is dependent on the amplitude of the input signal.

In another arrangement for producing said derived signal use is made of a valve having an exponential input/output transfer characteristic and a further arrangement employs an additional semi-conductor device having an exponential transfer characteristic.

Figure 11:
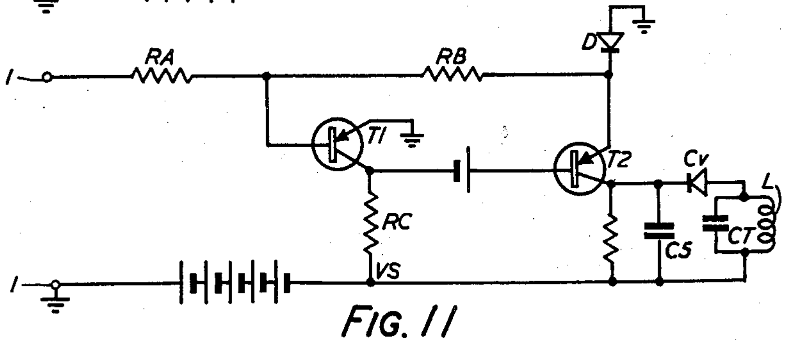
Figure 12:
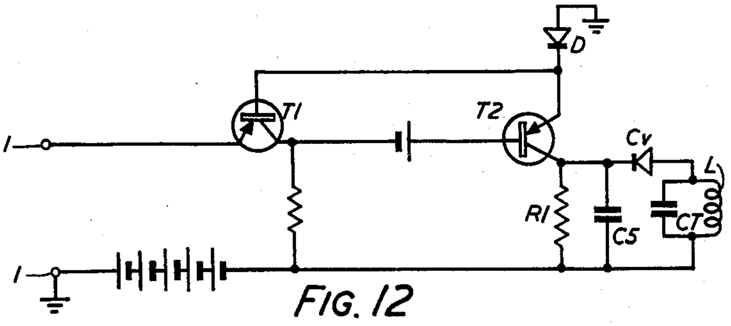
Figure 13:
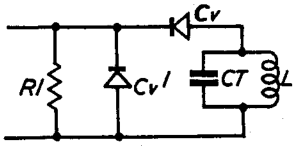

The invention is further described with reference to and illustrated in the accompanying drawings in which each of FIGURES 1, 3, 5 and 6 is a circuit diagram of an embodiment of the invention adapted to provide a linear frequency sweep; FIGURES 2 and 4 are explanatory graphical figures relating to the embodiments of FIGURES 1 and 3, respectively; FIGURES 7, 8, 9, 10, 11 and 12 are circuit diagrams of further embodiments of the invention; and FIGURE 13 shows a modification applicable to the embodiments of FIGURES 7, 8, 9, 10, 11 and 12. In the figures like parts are denoted by like references.

Figure 2:
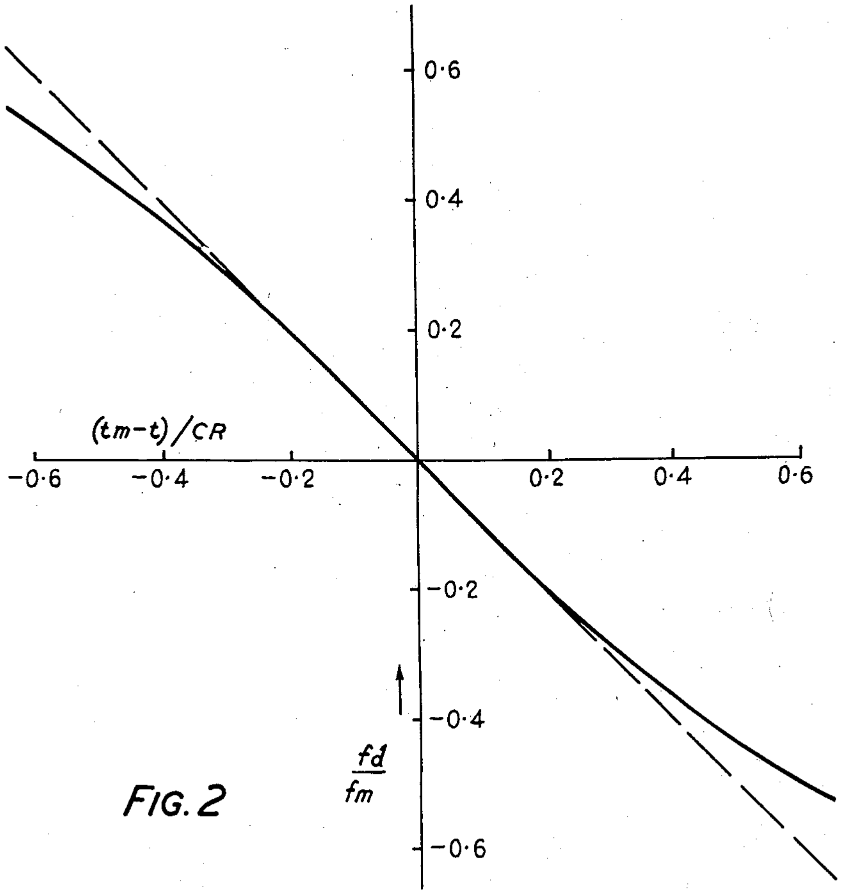

Referring to FIGURE 1 the circuit comprising the fixed inductance L and fixed capacitance $C_T$ and which may comprise, for example, the frequency determining circuit of an oscillator has connected across it in series with the parallel connected resistance R and condenser C, a silicon junction diode $C_V$ of the kind in which a so-called "depletion layer" is formed. Such a diode is said to be "sharp." The effective capacitance of diode $C_V$ is dependent on the reverse biassing voltage across it. The source of D.C. potential $V_P$ is connected to the terminals of condenser C, which is of negligible impedance at the operating frequency of the resonant circuit formed of L, $C_T$ and $C_V$, by means of the switch S.

The relationship between the effective capacitance $C_V$ of a semi-conductor diode of the kind referred to and the voltage V across it is given by $$C_V=k(V+V_0)^{-1/2} \qquad (1)$$

where $k$ is a constant and $V_0$ is a constant voltage of about half a volt. In the present case the condenser C is of much greater value than either $C_V$ or $C_T$ and consequently the voltage across the condenser C, after rising to the value $V_P$ when the switch S is closed, will decrease exponentially when the switch is opened. This decreasing voltage V is therefore given by $$V=V_p e^{-\frac{t}{CR}} \qquad (2)$$

where $V_p$=voltage of source $V_p$ $t$=time, and C and R are the values of the condenser and resistance carrying those references.

Assuming, for the present, that in Equation 1 the term $V_0$ may be ignored it will be seen that $$C_V=kV_p^{-1/2}e^{\frac{t}{2CR}} \qquad (3)$$

The frequency of the resonant circuit is given by $$f=\tfrac{1}{2}\pi L^{\frac{1}{2}}(C_T+C_V)^{\frac{1}{2}} \qquad (4)$$

Suppose that $C_V=2C_T$ at time $t=t_m$ when $f=f_m$ then $$\frac{f}{f_m}=\left[\frac{3}{1+C_V/C_T}\right]^{1/2} \qquad (5)$$

Substituting for $C_V$ and $C_T$ the values derived from Equation 3 we obtain $$f=f_m\sqrt{3}[1+2e]^{\frac{(t-t_m)^{-1/2}}{2CR}} \qquad (6)$$

From this it may be shown that the maximum rate of change of frequency with time occurs at $t=t_m$ when $$\frac{df}{dt}=\frac{-f_m}{6CR} \qquad (7)$$

Hence by suitably choosing the values C and R the rate of change of frequency at $f_m$ may be made to have any desired value.

If it is assumed that the ideal linear slope is given by Equation 7 then the ideal frequency deviation is given by $$f_d'=f_m(t_m-t)/6CR \qquad (8)$$

The prime being used to indicate that this is an ideal value. The true deviation is, of course, given by subtracting $f_m$ from Equation 6

$$f_d=f_m\sqrt{3}[1+2e]^{\frac{(t-t_m)^{-1/2}}{2CR}}-1 \qquad (9)$$

FIGURE 2 in which the ordinates represent normalised frequency $f_d/f_m$ and the abscissae represent normalised time $(t_m-t)/CR$ shows in full line the actual variation of frequency and in dashed line the ideal linear variation. It will be seen that the curve of actual variation of frequency departs very little from the ideal over a very wide frequency range. Thus for a frequency sweep of 3:1 (i.e. $f_d/f_m=\pm\frac{1}{2}$) the maximum error is just over 2½% of the deviation.

In the above analysis the effect of the value of C on the resonant frequency has been ignored. In practice if C is greater than $100C_T$ its effect, and the effect of the varying value of $C_V$ on the exponential modulating voltage, will be negligible.

Furthermore as the circuit behaves substantially linearly over a wide frequency range it is clear that the ratio of $C_V$ to $C_T$ at the centre frequency $f_m$ is not critical and a change from ideal ratio $C_V=2C_T$ slightly increases the maximum error at one end of the sweep.

It may be shown that if the applied voltage $V_P$ is much larger than $V_0$ (e.g. $V_p=100V_0$) then the error in frequency introduced by ignoring the term $V_0$ in the Equation 3 is small and is represented mainly by a linear term, which is not significant, and a parabolic term. Furthermore linear and parabolic terms are introduced by having a finite value for C. The parabolic terms may be eliminated by applying suitable bias to the semi-conductor diode $C_V$. The best value of this bias is preferably found by trial and error.

Figure 3:
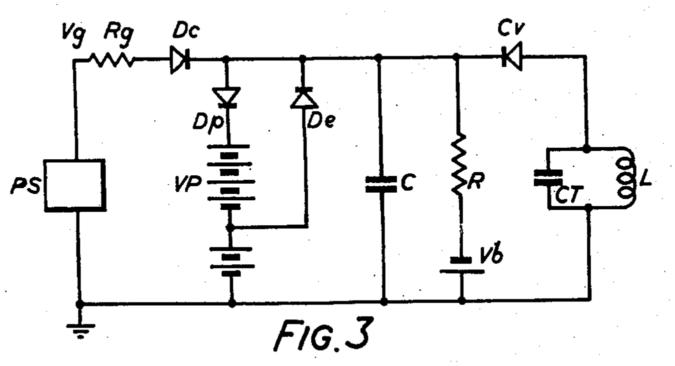
Figure 4:
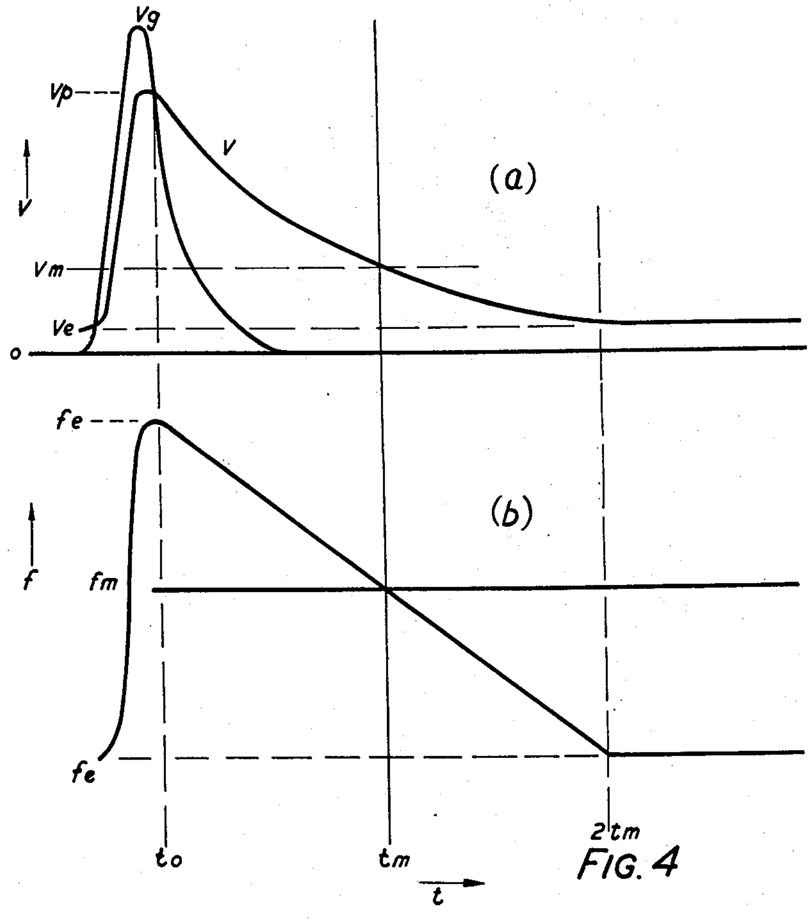

FIGURE 3 shows a modification of the embodiment of FIGURE 1 in which the semi-conductor diode $C_V$ is biassed by a battery $V_b$. In place of the D.C. source $V_p$ there is a pulse source PS whose output is applied to charge the condenser C through a resistance $R_g$, which may be constituted wholly by the internal resistance of the source or, in part by a separate resistance, and a suitably poled diode $D_c$. The mean frequency of the resonant circuit will depend not only on the values of L, $C_T$ and $C_V$ but also on the peak voltage to which the condenser C is charged. It is therefore desirable to stabilise this peak value. In FIGURE 3 this is done by connecting the battery $V_p$ and diode $D_p$ across condenser C. With this arrangement the peak value to which the condenser C can be charged is the voltage $V_p$ of the battery carrying that reference. In order to ensure that the diode $C_V$ does not become forward-conducting a further diode $D_1$, oppositely poled to diode $D_P$, is connected between one terminal of condenser C and a tap on battery $V_p$. The connection of diode $D_1$ between C and $V_p$ is of course a refinement and is not essential.

FIGURE 4 shows typical waveforms which are obtained with the arrangement of FIGURE 3. In FIGURE 4(*a*) the curve $V_g$ is a pulse waveform from source PS and the curve V represents the potential of the condenser C. It will be seen that this potential has a maximum value $V_p$ and a minimum value $V_1$. In FIGURE 4(*b*) the curve therein shown is a curve of frequency against time and it will be seen that during the discharge period of the condenser C the variation of frequency with time is substantially linear.

Figure 5:
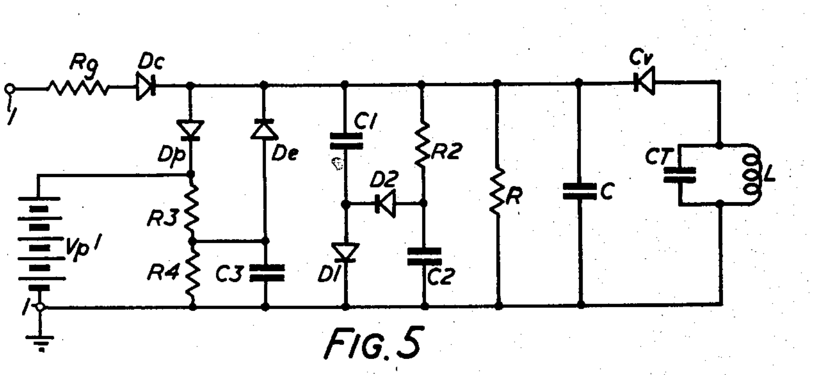
Figure 6:
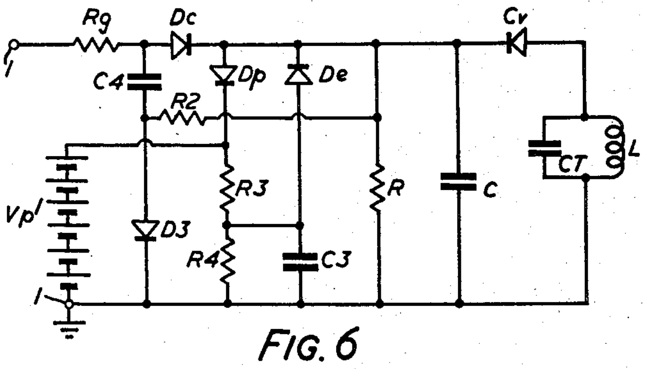

FIGURES 5 and 6 show further modifications of the arrangement of FIGURE 4. In both these figures the pulse source PS of FIGURE 3 is connected in use between the terminals 1, 1. Battery $V_p'$ has across it a potentiometer comprised of series resistances $R_3$ and $R_4$, the common junction of which is connected to the diode $D_1$ and is connected to earth via a condenser $C_3$ which acts as a short circuit at the pulse repetition frequency. In FIGURE 5 negative bias for the semi-conductor diode $C_V$ is provided by means of the rectifier arrangement comprising condensers $C_1$ and $C_2$, diodes $D_1$ and $D_2$ and resistor $R_2$. With this arrangement a negative bias is developed at the junction of condenser $C_2$ and resistance $R_2$ and as the value of resistance $R_2$ is chosen to be many times larger than R a small proportion of this bias is effectively applied to diode $C_V$. In the arrangement of FIGURE 6, which is particularly useful in cases in which the pulse repetition frequency is low (say 250 c./s.), the negative biassing arrangement for diode $C_V$ comprises condenser $C_4$, diode $D_3$ and resistance $R_2$, the condenser $C_4$ being connected in this case on the pulse source side of diode $D_C$. As has been said, this arrangement is suitable for low pulse repetition frequencies, and, more particularly, for cases in which the input pulse return time is short compared with $2t_m$ and the product $C_4R_2$ is long compared with $2t_m$.

The minimum value of condenser $C_T$ is usually determined in practice by the input capacitance of the valve or transistor to which the resonant circuit is coupled, as it will be where the resonant circuit forms part of an oscillator or is coupled to a signal source or detector where it forms part of a panoramic detector. As $C_V=2C_T$ at the mean frequency, the minimum value of $k$ (see Equation 1) is determined by the value of $C_T$ and hence it is necessary to choose a semi-conductor diode $C_V$ having a value of $k$ above this minimum value. The required value of $C_T$ and also of L may now be determined. In practice $C_T$ and L may be set approximately to the correct values and $C_T$ is then successively adjusted until the highest sweep frequency is correct and L is successively adjusted to correct the lowest frequency.

Figure 7:
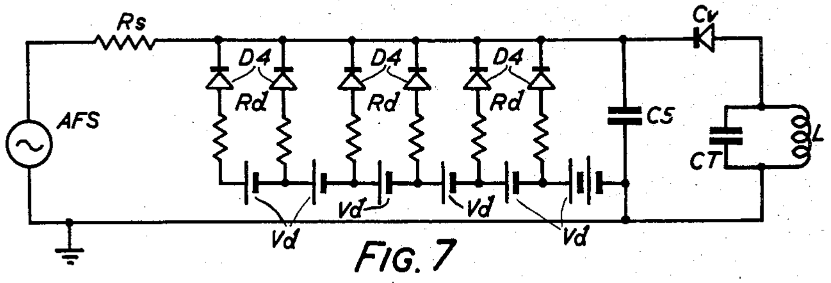

FIGURE 7 illustrates an embodiment of the invention which is suitable for frequency modulation where it is not a question simply of producing a linear frequency sweep but where the variations in frequency of the resonant circuit—which may form part of an oscillator—are required to be in accordance with a modulating wave. Such a requirement commonly arises, for example, in audio and television signal transmission. In the arrangement of FIGURE 7 the output from an audio frequency source AFS is applied to the semi-conductor diode $C_V$ and the circuit L—$C_T$ via a transfer circuit which has an input/output characteristic of exponential shape, e.g. the input/output characteristic is such that if a linearly increasing input voltage were applied to the transfer circuit an exponentially increasing output voltage would be obtained. In FIGURE 7 the transfer circuit is constituted by a number of resistances $R_D$ each connected in series with its own diode $D_4$. All the resistance—diode combinations are connected in parallel across the source AFS and each of the diodes $D_4$ is conductively biassed to a different extent. As the positive voltage from source AFS increases the diodes will be rendered non-conducting in turn, each effectively disconnecting the resistance $R_D$ to which it is serially connected and hence causing the overall resistance of the transfer circuit to increase. Due to the presence of resistance $R_S$, which may be constituted wholly by the internal resistance of the source AFS or, in part, by an additional resistance, the output voltage of the transfer circuit will increase at an increasing rate. Condenser $C_5$ is chosen to have high impedance at the modulating frequency but low impedance at the frequency of the resonant circuit.

Figure 8:
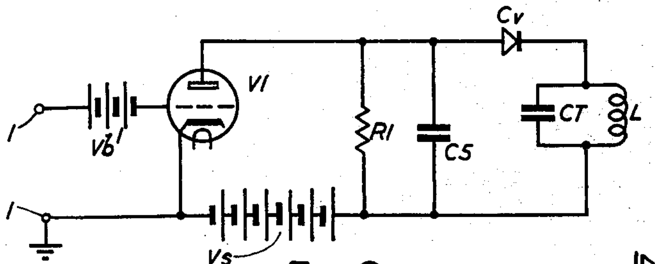

A transfer circuit having an exponential input/output characteristic need not be of such complicated nature as that of FIGURE 7 and may comprise, as illustrated in FIGURE 8, a valve $V_1$ having an exponential characteristic. The valve $V_1$ is biassed to a suitable point on its characteristic by battery $V_b'$ and the modulating voltage is applied to terminals 1. Battery $V_S$ provides the HT voltages for the valve, and, because of the sense of connection of this battery, semi-conductor diode $C_V$ is poled in the opposite direction from the previously illustrated arrangements. Clearly the diode $C_V$ in all the embodiments of the invention must be so poled that it is always reverse-biassed.

Figure 9:
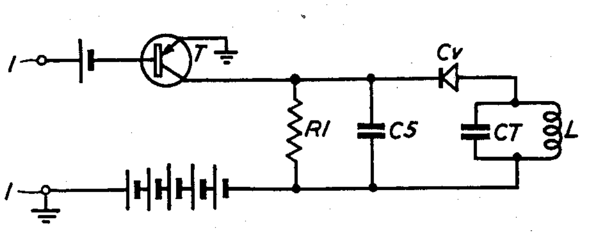
Figure 10:
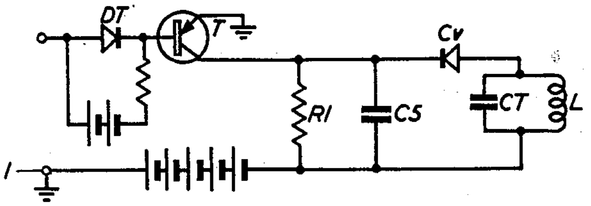

FIGURE 9 shows an embodiment in which the exponential transfer characteristic is provided by a p-n-p transistor T which is biassed to operate at medium currents. Under such conditions transistors present the desired exponential transfer characteristic although they suffer from the defect that the shape of this characteristic is temperature dependent. This defect may be overcome, however, as shown in FIGURE 10, by the provision of a diode $D_T$ having a similar temperature coefficient to the transistor T and connected to compensate therefor. It should be noted that transistors operating at low currents and at high currents do not possess the required exponential characteristic.

The exponential transfer characteristic of a transistor is due to the characteristic of the emitter base diode and hence it is possible to use a similar diode separately from the transistor, the separate diode arrangement being free of the limitation that it is only effective at medium currents. Two such arrangements are shown in FIGURES 11 and 12. In these figures the diode D is the diode in question and is connected in a feedback path between transistors $T_2$ and $T_1$ with the result that the current through the diode is automatically maintained at a value proportional to the exponential of the input voltage apart from a small bias. As the majority of the current through diode D also flows through resistance $R_1$ the voltage across $R_1$, which is applied to the semi-conductor diode $C_V$, is similarly related to the input voltage which is applied across terminals 1. In the arrangement of FIGURE 11 if resistance $R_A$ is much greater in value than resistance $R_B$ the effect of the temperature coefficient of the diode D will be small. The arrangement of FIGURE 11 is suitable for use with a high impedance source of modulating voltage while that of FIGURE 12 is more suitable for a low impedance source and has the added advantage that the ideal amount of feedback from diode D is disturbed only by the difference between the base currents of $T_1$ and $T_2$ whereas in FIGURE 11 there is an additional current through $R_b$.

In the arrangements of FIGURES 7, 8, 9, 10, 11 and 12 the condenser $C_5$ may be replaced by a further semi-conductor diode $C_V'$ as shown in FIGURE 13. In such a case each of the semi-conductor diodes may have a value of twice that which would be required of diode $C_V$ were $C_V'$ not present. This arrangement is desirable in some cases in order to give a better high frequency response.

I claim:

1. A frequency varying circuit arrangement comprising a resonant circuit having in a parallel branch thereof a voltage sensitive condenser constituted by a semi-conductor device of the kind presenting a capacitance which is dependent on the value of a reverse bias voltage applied to said device, means for deriving a voltage varying exponentially with time and means for applying to said device as reverse bias voltage a voltage comprised at least in part of said derived voltage, the relationship between the effective capacitance of said branch at the mean frequency over which said frequency varying arrangement is designed to vary and the total effective capacitance of said resonant circuit being such that the variation of frequency is substantially linear.

2. An arrangement as claimed in claim 1 wherein the effective capacitance of said branch at the mean frequency of the range over which said circuit arrangement is designed to vary is at least approximately equal to two-thirds of the total effective capacitance of said resonant circuit.

3. An arrangement as claimed in claim 1 wherein said semi-conductor device is a junction diode of the kind in which a so-called "depletion layer" is formed.

4. An arrangement as claimed in claim 3 wherein the semi-conductor device is a silicon junction diode.

5. An arrangement as claimed in claim 1 wherein the means for deriving a voltage varying exponentially with time includes a condenser, said last mentioned condenser being discharged to produce across the same a voltage decaying exponentially with time whereby the frequency of the resonant circuit varies substantially linearly with time.

6. An arrangement as claimed in claim 5 wherein said means for deriving a voltage varying exponentially with time is a source of unidirectional potential, energy being stored in the condenser by connection to said source.

7. An arrangement as claimed in claim 6 wherein said means for deriving a voltage varying exponentially with time is a pulse source operating at the repetition frequency equal to that at which said linear frequency variation is to be produced.

8. An arrangement as claimed in claim 1 including means for producing a modulating input signal wave wherein the frequency of the resonant circuit is required to vary substantially linearly in accordance with said modulating input signal wave and wherein said deriving means includes means for producing from said input signal wave a derived signal wave of amplitude varying substantially exponentially with the amplitude of the input signal wave, and wherein said applying means applies said derived signal wave as reverse bias to said device.

9. An arrangement as claimed in claim 8 wherein the means for producing the derived signal wave from the input signal wave comprises a plurality of parallel branches each including a differently biassed unilaterally conductive device in series with an impedance and wherein the input signal is applied, in series with an impedance across the parallel branches in opposition to the bias of siad unilaterally conductive devices whereby the effective impedance of said parallel branches, and hence the proportion of the input signal appearing across said branches, is dependent on the amplitude of the input signal.

10. An arrangement as claimed in claim 8 wherein the means for producing the derived signal wave from the input signal wave includes an additional semi-conductor device having an exponential transfer characteristic and connected across the parallel branches in opposition to the bias of said unilaterally conductive devices whereby the effective impedance of said parallel branches, and hence the proportion of the input signal appearing across said branches, is dependent on the amplitude of the input signal.

References Cited in the file of this patent

UNITED STATES PATENTS 2,570,939 Goodrich -------------- Oct. 9, 1951

OTHER REFERENCES

Hammerslag: Circuit Design Using Silicon Capacitor Electronics, Sept. 18, 1959 (pages 49–50 relied on).